(12) United States Patent
Aurongzeb (10) Patent No.: US 8,358,066 B1
(45) Date of Patent: Jan. 22, 2013

(54) ORGANIC LIGHT EMITTING DIODE PACKAGE WITH ENERGY BLOCKING LAYER

(75) Inventor: Deeder Aurongzeb, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/206,575

(22) Filed: Aug. 10, 2011

(51) Int. Cl.
    *H01J 1/62* (2006.01)
(52) U.S. Cl. .................................. 313/512; 313/506
(58) Field of Classification Search .................. 313/512, 313/498, 504, 506
    See application file for complete search history.

(56) References Cited

U.S. PATENT DOCUMENTS

| | | |
|---|---|---|
| 7,075,226 B2 | 7/2006 | Cok |
| D623,795 S | 9/2010 | Ngai et al. |
| 2004/0000863 A1 | 1/2004 | Miyake |
| 2006/0033115 A1* | 2/2006 | Blochwitz et al. .............. 257/94 |
| 2007/0064446 A1 | 3/2007 | Sharma et al. |
| 2009/0121624 A1* | 5/2009 | D'Andrade et al. .......... 313/504 |
| 2010/0026176 A1* | 2/2010 | Blochwitz-Nomith et al. ............................ 313/504 |

FOREIGN PATENT DOCUMENTS

| | | |
|---|---|---|
| JP | 2007017742 A | 1/2007 |
| WO | 2005083813 A2 | 9/2005 |

OTHER PUBLICATIONS

PCT Search Report and Written Opinion dated Nov. 13, 2012 from corresponding Application No. PCT/US2012/046893.

* cited by examiner

*Primary Examiner* — Vip Patel
(74) *Attorney, Agent, or Firm* — GE Global Patent Operation; Peter T. DiMauro (57) ABSTRACT

An organic electroluminescent device with new protective packaging. The package has a substantially transparent energy blocking layer disposed near the outer surface of the device. The energy blocking layer is configured to protect the electroluminescent device and packaging from ultraviolet, infrared, and other electromagnetic radiation. The energy blocking layer can also be configured to have a limiting oxygen index (LOI) of greater than twenty-one to reduce combustibility of the device and can optionally contain hydrophobic properties to help protect the device from moisture.

28 Claims, 5 Drawing Sheets

ORGANIC LIGHT EMITTING DIODE PACKAGE WITH ENERGY BLOCKING LAYER

BACKGROUND

1. Field of the Invention

The aspects of the present disclosure relate generally to the field of light emitting electrical packages, and in particular to an organic light emitting diode package with energy blocking layers.

2. Description of Related Art

An Organic Light Emitting Diode (OLED) is a type of electroluminescent device in which light is generated within an organic compound formulated to emit light when electric current is applied. An OLED is commonly fabricated from two types of organic materials, small molecules and polymers. Commonly used small molecules include organometallic chelates, fluorescent and phosphorescent dyes and conjugated dendrimers. A second type of OLED is constructed from conductive electroluminescent or electro-phosphorescent polymers. These devices are sometimes referred to as Polymer Light Emitting Diodes (PLED) or Polymer Organic Light Emitting Diodes (P-OLED). Typical polymers used in P-OLED construction include electroluminescent derivatives of poly(p-phenylene vinylene) and polyfluorene or electro-phosphorescent materials such as poly(vinylcarbazole). Traditionally, the term OLED referred only to devices constructed from small molecules, however in recent years OLED has been used to refer to both small molecule and polymer type of devices. When referring to a specific type of organic material, SM-OLED is used to describe a Small Molecule Organic Light Emitting Diode, and P-OLED is used to refer to a Polymer Organic Light Emitting Diode. For the purposes of this disclosure the term Organic Light Emitting Diode and the acronym "OLED" is defined to refer generally to devices constructed using both types of organic material.

OLEDs are well known in the art and are typically built as a laminate on top of a suitable substrate material such as glass or a polymer. It is known that materials used in OLEDs can be degraded by exposure to water and/or oxygen and is accelerated with heat. Both device and packaging materials can also be degraded from exposure to many types of electromagnetic radiation. Therefore, OLEDs need to be carefully packaged to protect them from these environmental influences. It is also important to carefully design these packages so that the environmentally sensitive packaging materials are adequately protected.

The degradation of the materials used in OLEDs by environmental factors significantly reduces the life expectancy of such devices. Cathodes are often made of metals such as barium or calcium because their low work functions promote injection of electrons into the LUMO of the organic layer. These metals are highly reactive and degrade rapidly when exposed to water or oxygen. Other materials, such as the organic materials used in the emissive layers and transparent conductive films used in the anode, are also susceptible to degradation from environmental factors. Polymeric materials are sensitive to radiation and degrade when exposed to infrared (IR) radiation in the range of 0.6 to 1.3 electronvolt (eV) or ultraviolet (UV) radiation in the range of 3.4 to 5 eV. Polyethylene terephthalate (PET), often used as a substrate material, will yellow when exposed to UV radiation. In addition to causing damage, UV and IR radiation also exacerbate water penetration problems. Rigorous encapsulation of OLED devices is therefore required.

An OLED's efficient conversion of electricity to light makes it desirable for use in lighting applications in homes and buildings. Materials used in buildings are often designed with fire safety in mind and many building codes place combustibility requirements on building materials. Fire safety standards for large OLED panels intended for use as lighting in buildings and homes require that the combustibility of materials used be taken into account in the design of OLED panels.

There are several standards used for rating flame retardant properties of materials from organizations such as American Society for Testing and Materials (ASTM), Underwriters Laboratories (UL), International Organization for Standardization (ISO), or National Fire Protection Agency (NFPA). A widely used measure of the flammability of polymeric materials is the Limiting Oxygen Index (LOI). The LOI is defined as the minimum concentration of oxygen in a nitrogen/oxygen mixture required to just support candle like combustion of a test sample. Dry air contains slightly less than 21% oxygen, so a material requiring a concentration of more than 21% oxygen to support combustion (LOI>21) will tend to retard the spread of fire. Materials having a LOI of 21% or more are referred to as fire retardant materials. The LOI is standardized in the United States under ASTM D 2863 and internationally by ISO 4589. The LOI of some commonly used polymers is shown in Table 1.

J. Troitzsch, International Plastics Flammability Handbook, Second Ed., Hanser Publishers, Munich, 1990

TABLE 1

| Polymer | LOI |
| --- | --- |
| Polyethylene | 18 |
| Polypropylene | 18 |
| Polystyrene | 18 |
| Poly(vinyl | 42 |
| Poly(tetrafluoroethylene) | 95 |
| Acrylonitrile-butadiene-styrene | 19 |
| Poly(methyl | 18 |
| Poly(acrylonitrile) | 27 |
| Polyamide | 25 |
| Polymaide | 24 |

For many purposes, one may desire light emitting or OLED devices to be generally flexible, i.e. are capable of being bent into a shape having a radius of curvature of less than about 10 cm. These light emitting devices are also preferably large-area, which means they have a dimension of an area greater than or equal to about 10 $cm^2$, and in some instances are coupled together to form a generally flexible, generally planar OLED panel comprised of one or more OLED devices, which has a large surface area of light emission. Flexible OLED devices usually comprise a flexible polymeric substrate, which while flexible, does not prevent moisture and oxygen penetration.

Accordingly, it would be desirable to provide an organic light emitting diode device that addresses at least some of the problems identified above.

SUMMARY OF THE INVENTION

As described herein, the exemplary embodiments overcome one or more of the above or other disadvantages known in the art.

One aspect of the exemplary embodiments relates to an OLED package that includes an organic light emitting device having a light-emitting surface and a non-light-emitting surface and a substantially transparent energy blocking layer disposed over the light-emitting surface.

Another aspect of the exemplary embodiments relates to an organic electroluminescent device including a transparent polymeric substrate having a top surface and a bottom surface with a transparent first electrode disposed above the top surface, a second electrode disposed above the transparent first electrode, an electroluminescent layer disposed between the first transparent electrode and the second electrode, and a substantially transparent energy blocking layer disposed below the bottom surface.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DETAILED DESCRIPTION OF THE INVENTION

Figure 1:
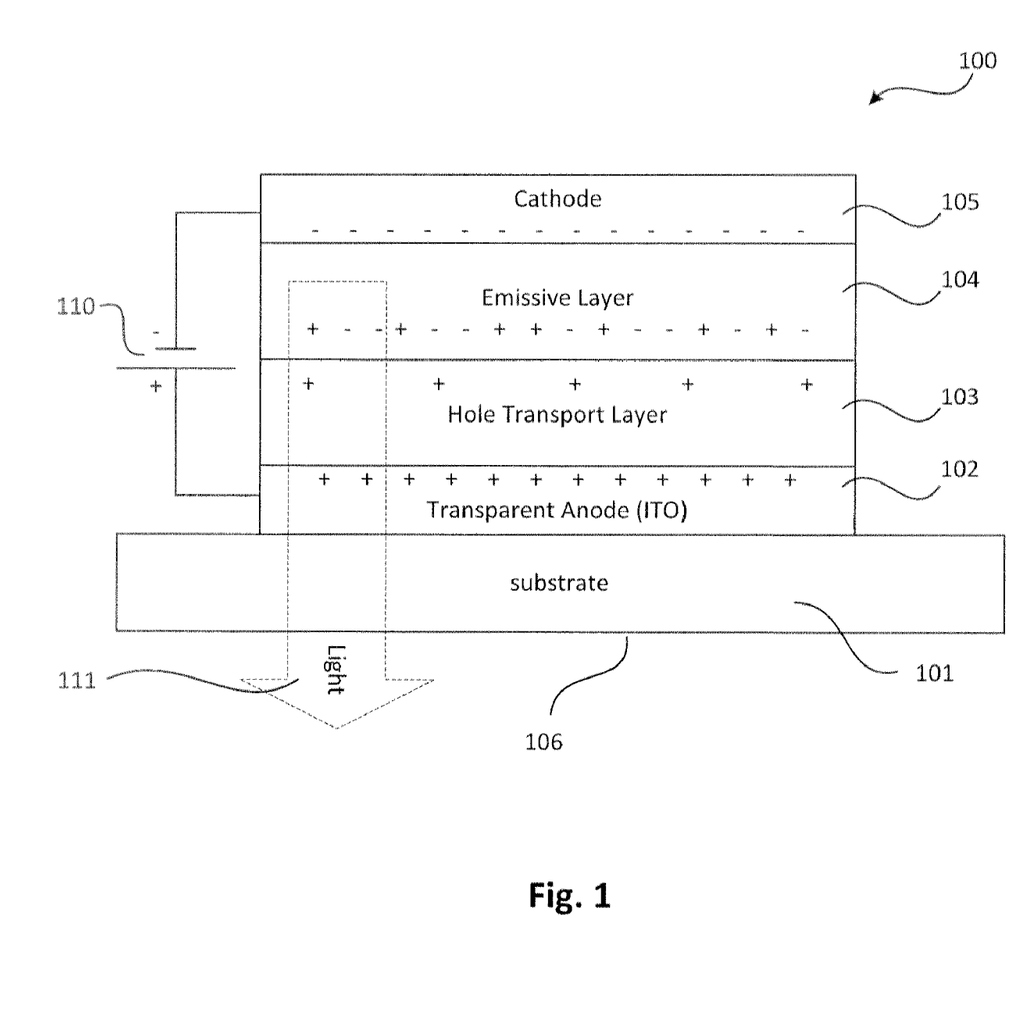
FIG. 1 illustrates a typical OLED device.

FIG. 1 illustrates a typical OLED device 100 in which organic layers 103, 104 are sandwiched between two electrodes 102, 105 disposed atop of a substrate 101. In the embodiment shown in FIG. 1, the substrate 101 is a transparent substrate. The organic layer 103 is generally described as a hole transport layer while the organic layer 104 is generally described as an emissive layer. As shown in the example of FIG. 1, the top electrode 105 is configured as a negatively charged cathode and the bottom electrode 102 is configured as a positively charged anode. The cathode 105 is made from a highly reflective metallic material that will reflect photons travelling upward back toward the substrate 101 while the anode 102 is made from a transparent conductive metal oxide that will allow photons to pass through. The OLED device 100 is configured as a bottom-emitting OLED device where light 111 generated in the organic layers 104 is reflected off the top electrode 105 or passes through the bottom electrode 102 and exits through the bottom surface 106 of the transparent substrate 101. When a voltage 110 is applied across the two electrodes 102, 105, a current of electrons flows from the top electrode 105 through the organic layers 103, 104 to the bottom electrode 102. Electrons enter the lowest unoccupied molecular orbit (LUMO) of the emissive layer 104 and exit from the highest occupied molecular orbit (HOMO) of the hole transport layer 103. Electrons exiting the hole transport layer 103 leave behind positively charged regions called holes. Electrostatic forces draw these holes into the emissive layer 104 where they combine with electrons at a luminescent center, usually in an organic molecule or polymer, resulting in the release of photons. The released photons have a frequency proportional to the energy gap between the HOMO and LUMO of each emitting molecule. Generated photons pass through the transparent substrate 101 and exit from the bottom surface 106 of the OLED device 100 as light.

Additional layers are often added to the OLED device 100 described above to improve efficiency and other characteristics. For example, disposing a hole injection layer (not shown) between the bottom electrode 102 and the hole transport layer 103 can improve charge injection by better matching the work function of the metal oxide used in the bottom electrode 102 with the HOMO of the hole transport layer 103. Electrons reaching the cathode 105 without recombining to release photons get wasted. Inserting an electron transport layer (not shown) between the cathode 105 and the emissive layer 104 can help prevent charges from reaching the cathode 105 without recombining Coatings and other layers may be added to control the index of refraction around the transparent substrate 101 to reduce the amount of light that gets trapped inside the device 100 due to reflections. In alternate embodiments, other layers may or may not be included in the light emitting structure 100 shown in FIG. 1 without straying from the fundamental concept of an organic light emitting diode (OLED) presented above.

In the OLED device 100 shown in FIG. 1, light 111 generated in the organic material exits the device 100 by passing through the transparent substrate 101 and out the bottom surface 106. The transparent substrate 101 is typically referred to as the bottom of the device 100 and configurations where light exits through the bottom surface 106 of the transparent substrate 101 are generally referred to as bottom-emitting devices. It is also possible to create an inverted or top-emitting device. In a top-emitting configuration the reflective cathode is placed near the transparent substrate 101 and the transparent anode is placed above the emitting layer 104 resulting in a configuration where generated light is reflected off the bottom electrode 102 and exits through the top of the device. In a top-emitting configuration the cathode is on the bottom next to the transparent substrate 101 where it can be used as the drain of an n-channel thin film transistor (TFT), allowing for construction of a low cost TFT backplane underneath the light emitting regions. A TFT backplane is useful for making active-matrix OLED displays. By using transparent materials in all layers of the OLED system, i.e. both electrodes 102, 105 as well as the substrate 101 are transparent, a fully transparent OLED can be created. Fully transparent OLED devices can be used to create devices such as heads-up displays, for example.

The OLED device 100 is subject to the influences and degradation effects of environmental factors such as moisture and oxygen. Also, since large panel OLED's are more commonly used in homes and buildings, these OLED devices must be compliant with building codes, including fire safety regulations. The aspects of the disclosed embodiments improve moisture and oxygen exclusion, reduce damage to the OLED device and its packaging from electromagnetic radiation, and improve resistance of an OLED device to combustion.

Figure 2:
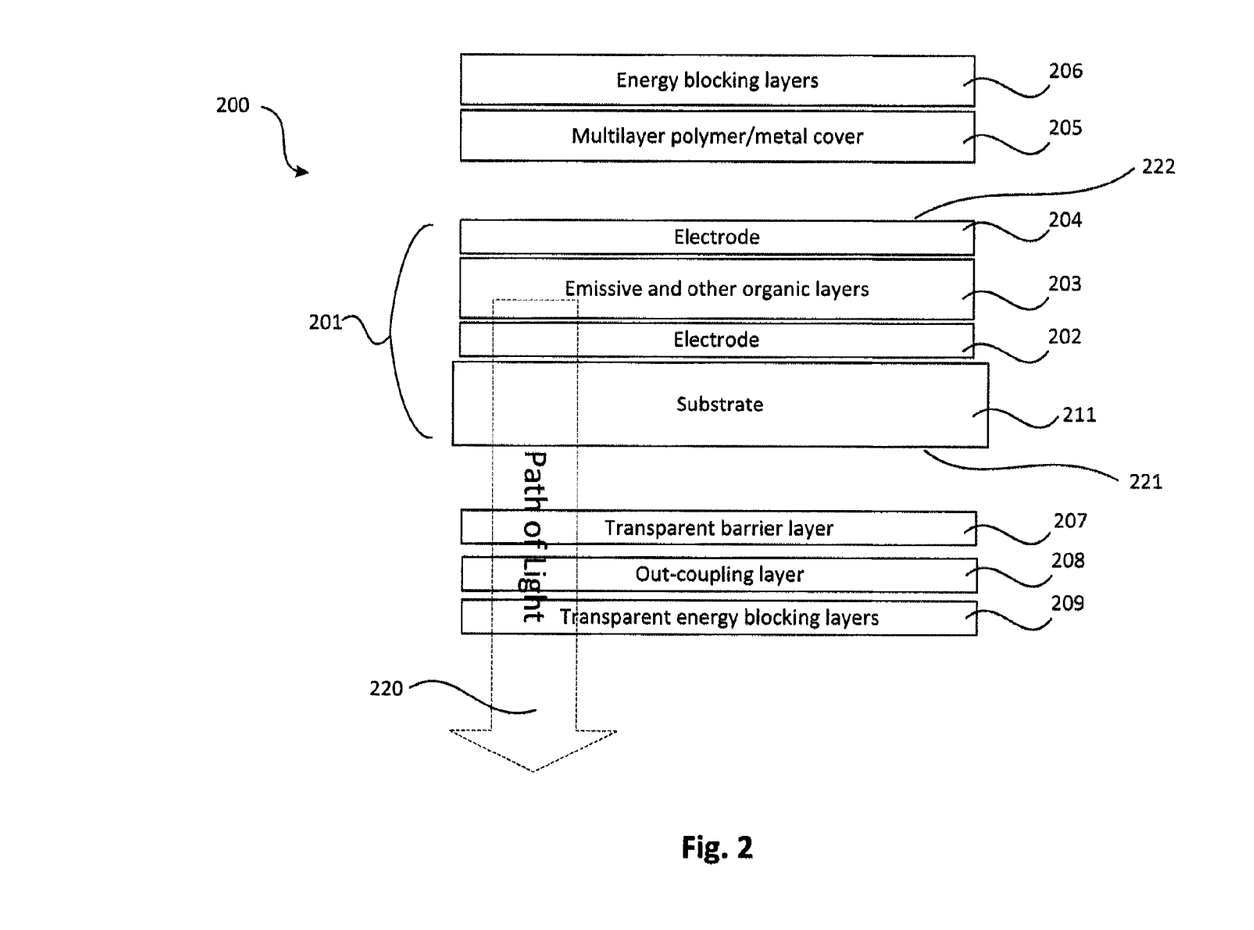
FIG. 2 illustrates an exemplary embodiment of a bottom-emitting OLED with additional packaging layers incorporating aspects of the present disclosure.

FIG. 2 illustrates an exemplary embodiment of the disclosure showing an OLED device 201, similar to the device 100 described above, encapsulated in packaging layers 205, 206, 207, 208 and 209. The bottom electrode 202 is configured as an anode comprising a substantially transparent nonmetallic conductive material. The bottom electrode 202 may be provided as a sheet or film, optionally disposed on a flexible substrate 101. The flexible substrate 101 typically comprises a flexible polymeric material, for example polyethylene naphthalate (PEN), polyethylene terephthalate (PET). A plurality of light emitting elements, each comprising a top electrode 204 and organic layers 203, is disposed on the bottom electrode 202. The top electrode 204 of each element is configured as a cathode comprising a reflective metallic material. The configuration of the plurality of light emitting elements will be described in more detail below. To ease description and understanding of the embodiments disclosed herein, this disclosure will continue to describe OLED devices 201 as generally planar and flat, however those skilled in the art will recognize that the devices disclosed herein, being generally flexible, may be bent into other shapes as desired. It will be understood by those skilled in the art that the layers of OLED package 200 are appropriate for packaging any general OLED device or devices that have a light-emitting side and a non-light emitting side and are not limited to the bottom-emitting configuration 201 shown in this exemplary embodiment.

For the purposes of this disclosure the relationship described by the terms "over" and "outside" refers to a layer that is farther away from the OLED being packaged and/or closer to the external environment. For example, describing the out-coupling layer as being "outside" or "over" the ultra-high barrier layer means that the ultra-high barrier layer is between the out-coupling layer and the OLED device.

In exemplary embodiments of the present disclosure the OLED device 201 is encapsulated or hermetically sealed with impermeable layers or films 205 and 207 to safeguard against moisture and oxygen ingress. These films are adhesively attached to the light-emitting surface 221 and non-light-emitting surface 222 of the OLED device 201, where the light emitting surface is covered with transparent barrier layer 207 and the non-light emitting surface is covered with a non-transmissive multi-layer cover or back sheet 205. In alternate embodiments the bottom-emitting OLED device 201 shown may be replaced with a top-emitting OLED device with its light-emitting surface 221 and non-light-emitting surface 222 positioned appropriately such that the light emitting surface faces the transparent packaging layers 207-208, 209 and 210 and the non-light emitting surface is covered by the back sheet 205. The OLED device 201 may be a single device constructed on a single substrate or alternatively may comprise multiple OLED devices. The OLED device 201 may also have one or more light emitting elements. To improve light transmission out of the device an out-coupling layer 208 is disposed over the transparent barrier layer 207. This layer helps increase the amount of light that can exit the device. Transparent energy blocking layer 209 and energy blocking layer 206 are disposed over layer 205 and 208 respectively to protect all internal layers of the packaged device 200.

Figure 3:
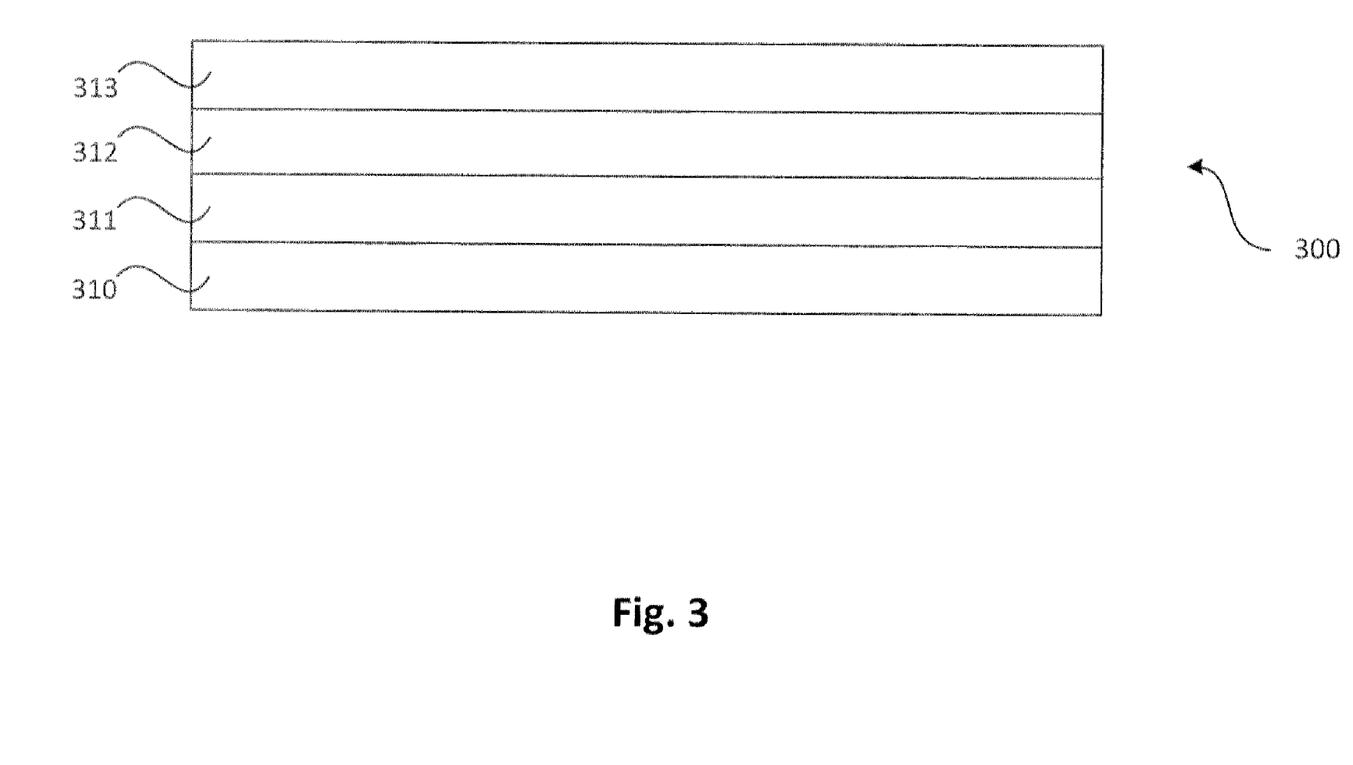
FIG. 3 illustrates an exemplary embodiment of an energy blocking layer for an OLED device incorporating aspects of the present disclosure.

FIG. 3 illustrates an exemplary embodiment of a substantially transparent energy blocking layer 209 that may be disposed between the encapsulation layers, 207-208 or 205, and the outside environment. These energy blocking layers are generally configured to improve the performance of the hermetic encapsulation, protect the encapsulation and the encapsulated devices 201 from damage by electromagnetic radiation and heat, and/or to reduce combustibility of the packaged device 200.

The exemplary embodiment of the energy blocking layer 300 is comprised of several sub-layers. Each of the sub-layers 310, 311, 312 and 313 shown in FIG. 3 is configured to provide separate protective properties. Although an energy blocking layer is generally described herein, it will be understood that many combinations and permutations of sub-layers are possible and various properties of the energy blocking layer can be incorporated into other packaging layers without straying from the spirit and scope of this disclosure.

The exemplary energy blocking layer 300 shown in FIG. 3 comprises four sub-layers. A polymeric fire retardant layer 310, a glass-based UV and IR radiation blocking layer 311, a conductive layer 312 to attenuate electromagnetic radiation that causes EMI, and a hydrophobic moisture blocking layer 313. The fire retardant layer 310 is comprised of a polymer film that is coated or enforced with materials to increase its LOI above 21. Suitable polymer materials for use in the fire retardant layer 310 include polyurethane, ethylene butyl acrylate, polymethyl methacrylate, polyester, polyethylene naphthalate (PEN), polyethylene terephthalate (PET), polyethylene oxide, or silica acrylate hydride. The LOI of these polymers is increased through the use of additive flame retardants such as boron, aluminum, phosphorus, antimony, and chlorine, or by adding nanocomposites such as silica particles, carbon nanotubes, graphene, graphene oxide, cerium oxide, or titanium dioxide nanoparticles. The polymer film of the fire retardant layer 310 can be either coated with or enforced with these additives. To maintain sufficient transparency when these materials are used as a coating, the overall thickness of the coating should be less than approximately 5 nm. When these materials are used to enforce, i.e. are mixed with, the polymer film of the fire retardant layer 310 the concentration of additives in the mixture should be less than approximately 10%.

The next sub-layer 311 of the energy blocking layer 300 is a radiation blocking layer disposed over the fire retardant layer 310. Polymeric materials used in the OLEDs and encapsulation are most sensitive to IR in the range of 0.6 to 1.3 electronvolt (eV) which corresponds to wavelengths of about 950 to 2100 nanometer (nm) and the ultraviolet (UV) in the range of 3.4 to 5 eV which corresponds to wavelengths of about 250 nm to 360 nm. By placing a radiation blocking layer 311 at or near the external surface of an OLED package 200, all internal materials, including encapsulation and fire retardant layer materials, can be protected from harmful radiation. The radiation blocking layer 311 will also reduce the rate of moisture ingress. This is because UV radiation can dissociate water into smaller dimer allowing for increased molecular diffusion through barrier layers while IR radiation allows more kinetic energy for increased movement. An exemplary embodiment of a radiation blocking layer 311 is comprised of a layer of thermally deposited borosilicate glass doped with approximately 1% to 2% by weight of zinc and cerium. These metals tend to turn to oxide when mixed with the glass and result in a transparent layer that effectively blocks the harmful UV and IR radiation. The thickness of the radiation blocking layer is the result of a tradeoff between flexibility and dopant amount where thinner coatings are more flexible but require higher doping amounts, and higher doping amounts reduce transparency. The minimum thickness of the radiation blocking layer is about 500 nanometers (nm) which is similar to the thickness of the OLED layers. A 200 micrometer (μm) thick layer is good for a semi-rigid panel and to achieve the flexibility desired for lighting applications a layer of approximately 50 µm thick is good. Other glass materials suitable for creation of the radiation blocking layer include chalcogenide glass and alumina silicate both with metal doping. The radiation blocking layer 311 can be constructed as a separate layer as is shown in FIG. 3 or it can be combined with the fire retardant layer 310 by mixing the doped glass material with the polymer of the fire retardant layer 310.

In an exemplary embodiment the radiation blocking layer 311 is coated with a layer of a hydrophobic polymer 312. Strictly speaking, this sub-layer does not block energy per se, however because water is one of the most pernicious of environmental influences, it is helpful to include extra moisture protection in the energy blocking layers. There are a variety of polymers available for this purpose. A layer of poly(styrene-co-divinylbenzene) can be used on polyethylene naphthalate (PEN) or poly(butyl methacrylate-co-ethylene dimethacrylate) is also suitable. Commercially available hydrophobic silica (for example RX200-Nippon) can also be used. Other examples of suitable materials are various clear polymer solutions available from Cytonix LLC, in Beltsville Md. and sold under the FLUOROPEL® trademark. These hydrophobic materials are usually obtained in solution, and when this is the case the hydrophobic layer 312 can be applied by wiping the solution onto the of the energy blocking layer 311.

As noted above, materials used in the OLED device, 100 of FIG. 1 or 201 of FIG. 2, as well as their packaging may be damaged by electromagnetic interference (EMI). EMI, which is sometimes called radio frequency interference (RFI), is caused by electromagnetic radiation leaking from electric and electronic devices. With the proliferation of computers, cell phones, audio visual equipment and other mobile computing devices, large levels of EMI are often present in environments where OLED displays and OLED lighting panels are used. To prevent EMI from penetrating the packaged OLED device 200, the energy blocking layer 311 can be adapted to include an EMI shield to attenuate the electromagnetic radiation that causes EMI. The radiation that causes EMI can be effectively reduced or attenuated by adding a sub-layer 313 of conductive material to the energy blocking layer 300. In one embodiment, the conductive material comprises a conductive mesh that is laminated into the fire retardant sub-layer 310. Conductive mesh is a screen like material with very fine wires. For example, using a conductive mesh having wires with a diameter of 50 µm spaced 267 µm apart provides about 70% light transmission and up to 100 dB attenuation. In an alternative embodiment, the sub-layer 313 can comprise a thin, less than approximately 5 nm, layer of a conductive low melting point metal, which is deposited on the radiation blocking layer 312. To maintain transparency this layer should be less than about 50 nm thick, for example 5 nm thick, depending on the light penetration depth of the material. While any conductive metal will work as a shield, it is preferred that at least one metal is magnetic or magnetic alloy. Magnetic metals useful for the EMI shield include cobalt, iron or preferably nickel. The EMI shield can also comprise a conductive oxide doped with a magnetic metal, e.g. Indium Tin Oxide (ITO). This thin film can be applied by, for example, vapor deposition. When implemented as a thin layer of conductive material the EMI shield can be segmented using a photolithographic process or other means to create a very fine wire-mesh like structure. By patterning the conductive layer in this way transparency is improved and by keeping the spacing between the segments smaller than the wavelength of radiation being blocked, adequate attenuation is still achieved. The radiation blocking layer described previously protects against electromagnetic radiation with wavelengths of around 100 nm to 10 µm. The conductive layer, or EMI shield, is used to protect against radiation with millimeter or greater wavelengths. For good attenuation, e.g. 20 dB or more, the largest distance between segments should be about $\frac{1}{20}^{th}$ of the wavelength being blocked. Therefore, for wavelengths of 1 millimeter or larger, segments should be spaced less than 50 µm apart.

Figure 4:
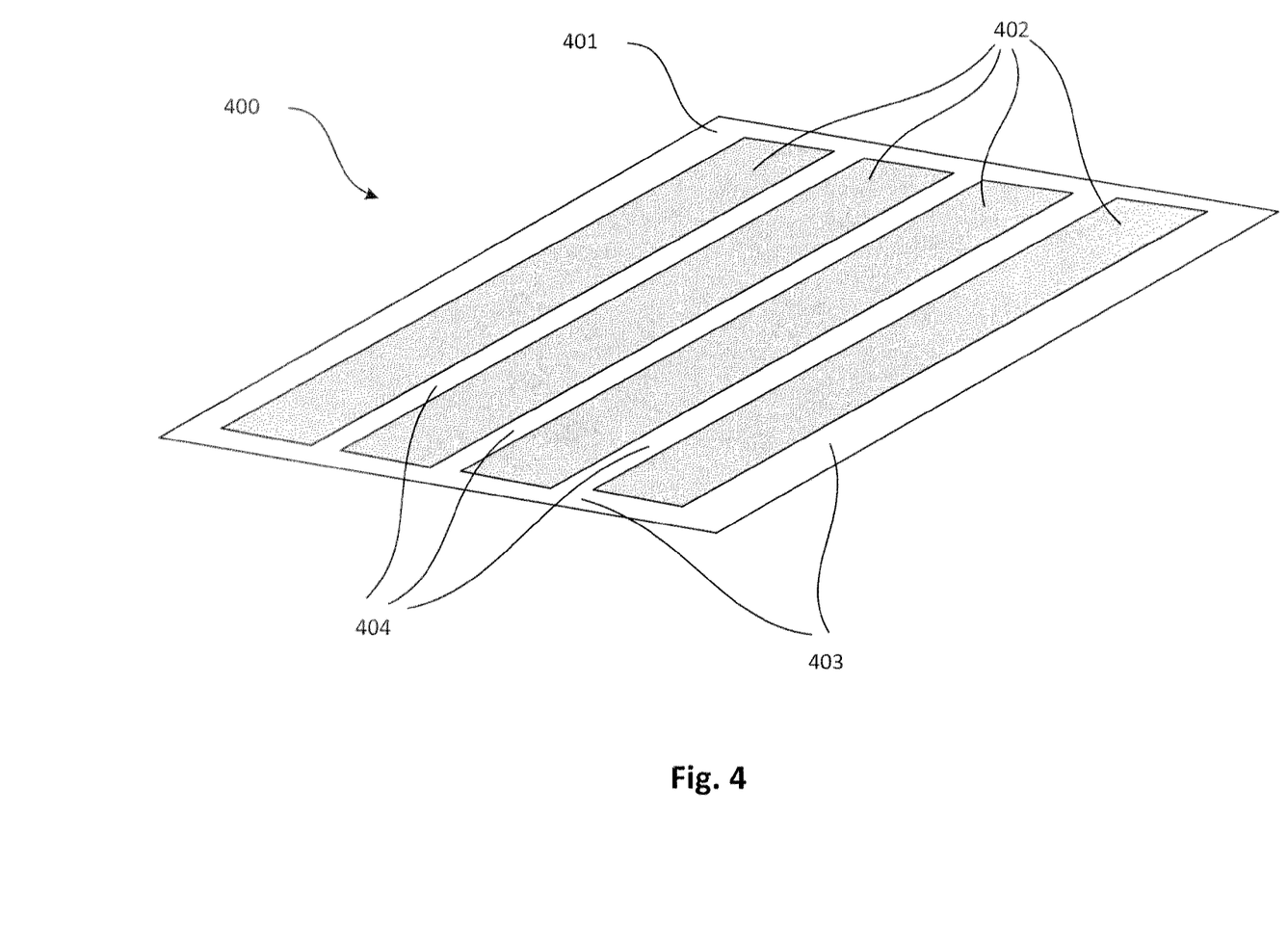
FIG. 4 illustrates an OLED lighting panel containing an array of light-emitting elements incorporating aspects of the present disclosure.

As described above, large OLED devices are often comprised of a plurality of light emitting elements. The elements are arrayed or tiled on a single substrate. An exemplary embodiment of an array or tiled OLED panel is shown in FIG. 4. In the exemplary embodiment illustrated in FIG. 4, the OLED device 400 contains an array of 4 ribbon-like light emitting elements 402 disposed on a single substrate 401. When the OLED device 400 is energized, the light emitting elements 402 define luminous regions of the package. For purposes of this disclosure, "peripheral areas" are defined as the non-luminous areas around the periphery 403 and between 404 the light emitting elements. When viewed as a plan view (a top view or bottom view, i.e., viewed perpendicular to the plane of the OLED device or panel) such peripheral areas are seen to generally surround the luminous regions. Light emitting elements 401 used in the panel can be either bottom-emitting OLED devices similar to the device shown in FIG. 1 or top-emitting devices. The luminous areas shown in the panel 400 are illustrated as being rectangular and arranged in a single row; however other light emitting element shapes can be arranged in different patterns without straying from the spirit and scope of the present disclosure. In a bottom emitting configuration, the light emitting surface of the device is the bottom of the substrate 401 and the in a top-emitting configuration the light emitting surface of the device is the top surface of the light emitting element 402. One skilled in the art will recognize that embodiments of the packages disclosed here are useful with a wide variety of OLED device types including those with a single light-emitting surface as well as those with two light-emitting surfaces, e.g. fully transparent OLEDs.

Panels created using a plurality of light emitting elements provide an opportunity to include additional fire retardant materials. Non-luminous peripheral areas 403, 404, surrounding the light emitting elements 402 can be covered by a thicker and/or less transmissive energy blocking layer without adversely affecting the light output of the panel. Thus an additional fire retardant layer which covers only the non-luminous peripheral areas 403, 404, of the OLED panel 400 can be added to the energy blocking layer 300. This layer has holes over each light emitting element 402 such that the light emitted is not blocked by the thicker fire retardant. In an alternative embodiment the additional fire retardant layer can be constructed as part of the fire retardant layer 310 by increasing the thickness of the fire retardant layer 310 in areas that cover the peripheral areas and leaving a thinner, more transparent layer in areas that cover each light emitting element.

For context, hereinbelow are described additional features of the light emitting package. In accordance with embodiments of the disclosure, at least one of the light emitting elements may comprise an organic electroluminescent material. In such embodiment, each light emitting element may be termed as an "OLED" or organic light emitting diode. The light emitting electrical package as a whole is configured to be flexible and/or conformal; that is, the light emitting package comprises flexibility sufficient to "conform" to at least one predetermined shape, at least once. For example, a "conformal" light emitting electrical package may be initially flexible enough to wrap around a cylinder body to form a fixture, and then not be flexed again during its useful lifetime. The light emitting electrical packages according to the present disclosure are generally flexible (or conformable).

Generally, the anode layer may be comprised of a substantially transparent nonmetallic conductive material. The requirements for a good transparent conductive nonmetallic coating (e.g., ITO) for OLED applications can be summarized by high light transmission (>than about 90%), low sheet resistance of 1 to 50 Ω/sq, high work function (sometimes as high as 5.0 eV) and low roughness below 1 nm (RMS). However, as a practical matter such desired parameters are not always easily achieved. Furthermore, transparent conductive nonmetallic coatings are typically brittle and may have defects due to processing conditions. Suitable materials for embodiments of the present disclosure include, but are not limited to, transparent conductive oxides such as indium tin oxide, indium gallium oxide (IGO), aluminum doped zinc oxide (AZO), fluorine doped tin oxide (FTO), zinc oxide, zinc-oxide-fluoride (fluorine doped zinc oxide), indium doped zinc oxide, magnesium indium oxide, and nickel tungsten oxide; conductive polymers such as poly(3,4-ethylene-diosythiophene) poly(styrenesulfonate) (PEDOT:PSS); and mixtures and combinations or alloys of any two or more thereof. Other substantially transparent nonmetallic conductive materials would be apparent to those of ordinary skill in the field.

Cathodes generally may comprise a material having a low work function such that a relatively small voltage causes the emission of electrons. Commonly used materials include metals such as tin, lead, aluminum, silver, and mixtures are used with metal or metal iodides of zirconium, calcium, barium, magnesium, rare earth elements or alloys of any two or more thereof. Alternatively, the cathode may comprise two or more layers to enhance electron injection. Non-limiting examples of the cathode may comprise a thin layer of calcium followed by a thicker outer layer of aluminum or silver.

In certain embodiments, the organic light-emitting layer is built up over the first electrode layer by solution-phase deposition, followed by solvent-assisted wiping or other patterning, and then a cathode layer is deposited over the organic light emitting layer by a vapor deposition, e.g., 100-1000 nm thick aluminum film. In one embodiment, the electrical package comprises a continuous un-patterned anode layer and a discontinuous cathode layer configured in a plurality of ribbon-like structures. An example ribbon-like structure is shown in 402 in FIG. 4. The term "ribbon-like" refers to the dimensions of the lighted areas of the device, which may be long and narrow and thin in cross-section.

OLED devices are typically encapsulated or hermetically sealed because moisture and oxygen have deleterious impact on the device layers. One or more OLED devices may be sealed, e.g. adhesively sealed; between two (or more) generally impermeable layers or films, at least one of which is generally transparent to allow the generated photons to escape as light. In many embodiments, one of these impermeable layers is a transparent ultra-high barrier, and another is a back sheet.

A back sheet (or back layer) may typically include a metal foil, such as aluminum or molybdenum foil or other conductive material, which is coated on both surfaces with a polymer insulator. In some embodiments, the back sheet may be a composite assembly that includes a metal foil that is encased or encapsulated within a polymer film or insulator on opposite surfaces of the metal foil. The back sheet generally exhibits excellent moisture and oxygen barrier characteristics due to the incorporation of a metal foil. Some suitable materials for use as a back sheet include commercially available multilayer packaging or lidding materials having moisture, and optionally oxygen, barrier properties in the form of films or sheets, such as heat-sealable materials.

A typical transparent barrier may be an ultra-high barrier (UHB) film as is generally known in the art. An UHB is typically a film comprised of layers of organic and inorganic materials designed to slow or ideally prevent the passage of water and oxygen. Inorganic films contain defects, which may be formed during manufacturing or developed over time, which allow moisture and oxygen to leak through. By stacking multiple layers of inorganic films separated by organic layers the water or oxygen molecules are forced to travel laterally between the inorganic layers to find defects in lower layers, thereby reducing the speed with which water and oxygen can find its way into the OLED. The UHB can have sharp boundaries between its layers or the boundaries of the UHB layers can be graded forming zones of mixed organic and in-organic material between zones of unmixed material. The use of graded layers can provide even greater protection from moisture and oxygen ingress.

An out-coupling layer may be placed in the path of the light emitted from the package. An out-coupling layer or film is formulated or coated to reduce the index of refraction thereby reducing the amount of light reflected back into the device. Creating microstructures or other surface patterns on the out-coupling layer provides varying angles of incidence to the generated light which can allow more light to escape. An out-coupling film may comprise scattering particles to divert light travelling through it. The light, which may have been reflected off layer boundaries, once diverted may be allowed to escape.

Figure 5:
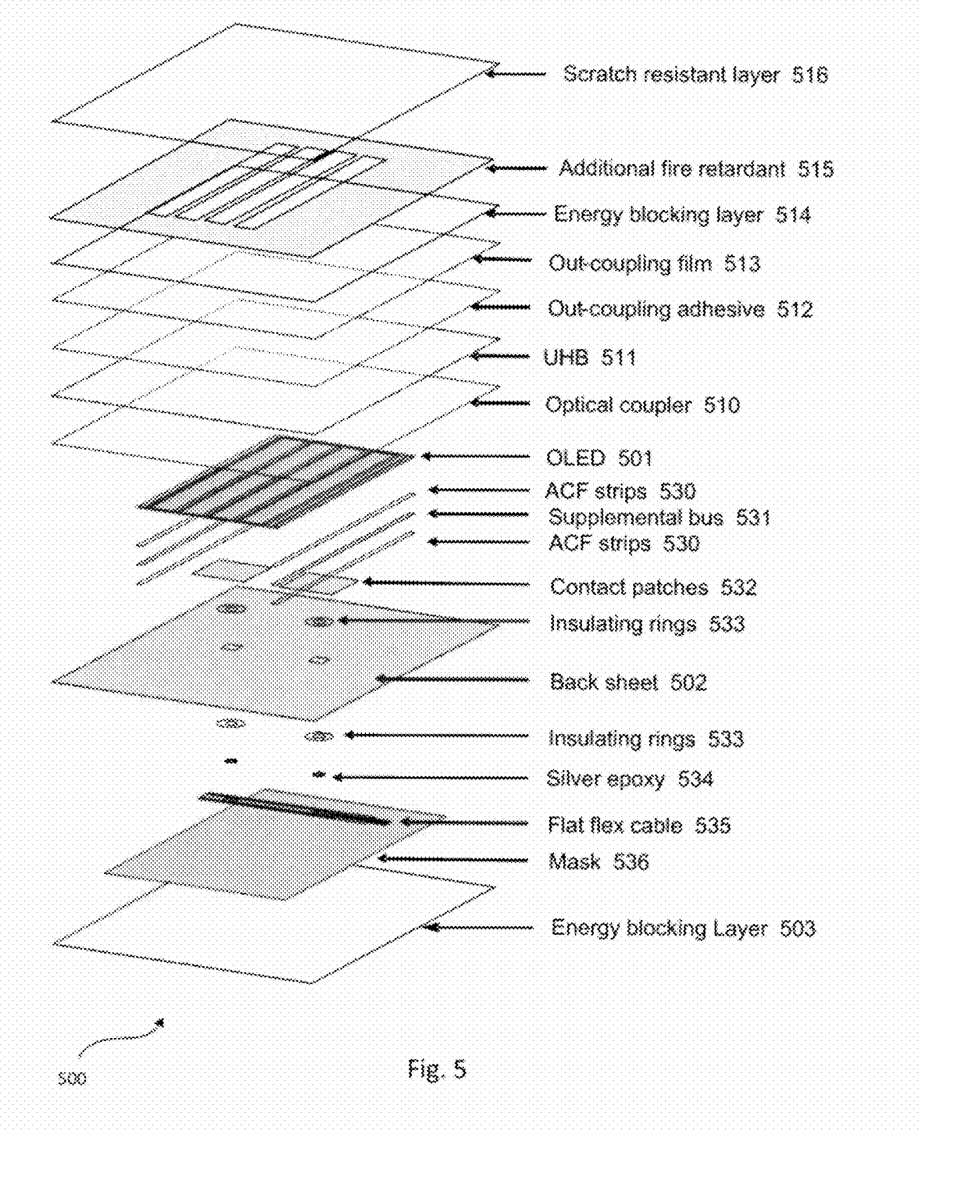
FIG. 5 illustrates an exemplary embodiment of an OLED package incorporating aspects of the present disclosure.

Referring now to FIG. 5 an exemplary embodiment of the present disclosure is depicted showing a packaged OLED panel 500. Additional packaging details have been included in FIG. 5 (such as components used to supply current 530-535 to the device, a mask 536, etc.) to provide context and should not be construed as defining or limiting the present disclosure. The OLED device 501 is pictured as an array of ribbon like elements as shown in FIG. 4; however one of ordinary skill in the art will recognize that OLED device 501 may be any OLED device configuration or group of OLED devices. The OLED device 501 is enclosed in various packaging layers and components to create a panel suitable for use in lighting applications. The non-light emitting side of the OLED device 501 is covered with a metal/polymer back sheet 502. This back sheet provides protection for materials used in the device and packaging and it is especially important that this back sheet 502 be designed to protect the sensitive metals used in the cathode. Because the back sheet 502 is placed on the non-light emitting side of the OLED device, opaque materials, such as metal foils, can be used. Opaque materials can provide better protection for the OLED device than transparent materials but may themselves be susceptible to damage from UV and IR radiation. The back sheet 502 may comprise an insulating adhesive layer and a hermetic metal layer but in any case must have sufficient thickness and homogeneity so as to be impervious to water and oxygen. Electrical current is brought in to the cathode of the OLED device 501 by a series of components 530 through 535 disposed between the OLED device 501 and a mask 536. These components comprise a supplemental bus 531 sandwiched between a set of ACF (anisotropic conductive film) strips 530. Current is brought to the ACF strips 530 by contact patches 532, insulating rings 533, silver epoxy 534 and a flat flex cable 535. An energy blocking layer 503 can be disposed on the bottom of the package to protect the back sheet 502 and other components contained in the OLED package 500.

Packaging on the light emitting side of the OLED device 501 aids transmission of light exiting the device and protects the device from environmental effects. An optical coupler 510 is placed directly on the light emitting side of the OLED device 501 to increase the amount of light that can exit the device. Studies have shown that up to 80% of light generated in the emissive layers can be reflected back into the device and become trapped due to reflections off layer boundaries. One purpose of the optical coupling 510 can be to reduce the index of refraction of the layer boundaries thereby allowing more light to exit the device. An ultra-high barrier 511 (UHB) is disposed over the optical coupler to slow the ingress of moisture and oxygen into the device. An out-coupling film 513 is bonded to the UHB 511 using an out-coupling adhesive 512. The out-coupling adhesive 512 ensures a low refractive index between the UHB and out-coupling film and otherwise has good optical properties to maximize the amount of light escaping the device. The out-coupling film 513 as discussed above comprises layers designed to aid the exit of light from the device. An energy blocking layer 514 is disposed over the out-coupling layer 513 to provide additional protection for the device and packaging layers. The out-coupling layer is often comprised of polymeric materials similar to those used in the energy blocking layer. This similarity of materials allows some of the properties of the energy blocking layer, such as high LOI, to be incorporated into the out-coupling layer. An energy blocking layer 514 as discussed above is disposed over the out-coupling layer 513. Some embodiments of the present disclosure combine the energy blocking layer with the out-coupling layer by incorporating fire retardant materials and electromagnetic energy blocking materials within the out-coupling film. In other embodiments the fire retardant layer is combined with the out-coupling layer by including fire retardant materials in the out-coupling film and the radiation blocking layer is added separately. Additional protection against combustion is provided by additional fire retardant 515. The additional fire retardant 515 is shown as a separate layer with holes over each light emitting element of OLED 501. It should be noted that the additional fire retardant 515 may also be included by varying the thickness of the energy blocking layer 514 as was described above. To protect the package from physical damage a scratch resistant layer 516 is disposed above the additional fire retardant 515. In other exemplary embodiments the scratch resistant layer can be before or after the energy blocking layers or alternatively it can be incorporated into the energy blocking layer.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An OLED package, comprising:
   an organic light emitting device having a light-emitting surface and a non-light-emitting surface; and
   a substantially transparent energy blocking layer disposed over the light-emitting surface.

2. The OLED package of claim 1, wherein the substantially transparent energy blocking layer is configured to block ultraviolet and infrared radiation.

3. The OLED package of claim 1, wherein the energy blocking layer has a LOI greater than twenty-one.

4. The OLED package of claim 1, further comprising a hydrophobic coating disposed over the energy blocking layer.

5. The OLED package of claim 2, wherein the substantially transparent energy blocking layer comprises:
   a polymeric film having a LOI greater than twenty-one; and
   a glass selected from the group comprising borosilicate glass, chalcogenide glass, and alumina silicate,
   wherein the glass is doped with a metal selected form the group comprising zinc, and cerium.

6. The OLED package of claim 5, wherein the glass comprises one to two percent by weight of the metal.

7. The OLED package of claim 1, wherein the organic light emitting device comprises a plurality of light emitting elements arranged to form luminescent regions and peripheral areas and the energy blocking layer further comprises a layer of fire retardant material placed over the peripheral areas.

8. The OLED package of claim 7, wherein the layer of fire retardant material is formed by increasing the thickness of the polymeric film over the peripheral areas.

9. The OLED package of claim 1, further comprising:
   an ultra-high barrier disposed between the light-emitting surface and the substantially transparent energy blocking layer; and
   an out-coupling layer disposed between the ultra-high barrier and the substantially transparent energy blocking layer.

10. The OLED package of claim 9, further comprising:
    a metal/polymer back sheet disposed over the non-light-emitting surface; and
    a second energy blocking layer disposed over the metal/polymer back sheet,
    the second energy blocking layer configured to block ultraviolet and infrared radiation and have a LOI greater than 21.

11. The OLED package of claim 1, comprising a conductive layer disposed over the substantially transparent energy blocking layer.

12. The OLED package of claim 11, wherein the conductive layer is a continuous layer.

13. The OLED package of claim 11, wherein the conductive layer is a segmented layer with spacing between segments smaller than a wavelength of electromagnetic radiation being blocked.

14. An organic electroluminescent device, comprising:
    a transparent polymeric substrate having a top surface and a bottom surface;
    a transparent first electrode disposed above the top surface;
    a second electrode disposed above the transparent first electrode;
    an electroluminescent layer disposed between the first transparent electrode and the second electrode; and
    a substantially transparent energy blocking layer disposed below the bottom surface.

15. The organic electroluminescent device of claim 14, wherein the substantially transparent energy blocking layer is configured to block ultraviolet and infrared radiation.

16. The organic electroluminescent device of claim 14, wherein the substantially transparent energy blocking layer has a LOI greater than twenty-one.

17. The organic electroluminescent device of claim 15, wherein the substantially transparent energy blocking layer comprises:
   a polymeric film having a LOI greater than twenty-one; and
   a glass selected from the group comprising borosilicate glass, chalcogenide glass, and alumina silicate,
   wherein the glass comprises a metal selected form the group comprising zinc, and cerium.

18. The organic electroluminescent device of claim 17, wherein the glass comprises one to two percent by weight of the metal.

19. The organic electroluminescent device of claim 17, wherein the glass is thermally deposited on the polymeric film.

20. The organic electroluminescent device of claim 17, wherein the polymeric film is enforced with the glass.

21. The organic electroluminescent device of claim 17, wherein the polymeric film comprises:
   a polymeric material selected from the group comprising polyurethane, ethylene butyl acrylate, polymethyl methacrylate, polyester, polyethylene naphthalate, polyethylene terephthalate, polyethylene oxide, and silica acrylate hydride; and
   a fire retardant material selected from the group comprising glass particle, carbon nanotube, graphene, ZnO, and TiO.
   wherein the fire retardant material comprises less than ten percent of the polymeric film.

22. The organic electroluminescent device of claim 17, wherein a hydrophobic coating is disposed above the energy blocking layer.

23. The organic electroluminescent device of claim 22, wherein the hydrophobic coating comprises a material selected from the group comprising poly(styrene-co-divinylbenzene), poly(butyl methacrylate-co-ethylene dimethacrylate), hydrophobic silica, acrylic polymer.

24. The organic electroluminescent device of claim 14, further comprising:
   an ultra-high barrier disposed between the bottom surface and the substantially transparent energy blocking layer; and
   an out-coupling layer disposed between the ultra-high barrier and the substantially transparent energy blocking layer.

25. The organic electroluminescent device of claim 24, further comprising:
   a metal/polymer back sheet disposed above the second electrode; and
   a second energy blocking layer disposed above the metal/polymer back sheet,
   the second energy blocking layer configured to block ultraviolet and infrared radiation and have a LOI greater than twenty-one.

26. The organic electroluminescent device of claim 24, wherein the substantially transparent energy blocking layer is combined with the out-coupling layer.

27. The organic electroluminescent device of claim 14, wherein a conductive layer is disposed above the energy blocking layer.

28. The organic electroluminescent device of claim 27, wherein the conductive layer comprises a less than 5 nm thick layer of a conductive low melting point metal.

* * * * *